(12) United States Patent
Hayashi et al.

(10) Patent No.: US 10,171,095 B2
(45) Date of Patent: Jan. 1, 2019

(54) ATOMIC OSCILLATOR, ELECTRONIC APPARATUS, MOVING OBJECT, AND MANUFACTURING METHOD OF ATOMIC OSCILLATOR

(71) Applicant: Seiko Epson Corporation, Tokyo (JP)

(72) Inventors: Nobuhito Hayashi, Chino (JP); Yoshiyuki Maki, Suwa (JP); Naoki Ishihara, Chino (JP); Noriaki Tanaka, Chino (JP); Hiroyuki Yoshida, Izumo (JP); Satoshi Kubo, Adachi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/648,847

(22) Filed: Jul. 13, 2017

(65) Prior Publication Data
US 2017/0310332 A1    Oct. 26, 2017

Related U.S. Application Data

(63) Continuation-in-part of application No. 14/489,959, filed on Sep. 18, 2014.

(30) Foreign Application Priority Data

Sep. 27, 2013  (JP) ................................. 2013-202238

(51) Int. Cl.
*H03L 7/26*      (2006.01)
*G04F 5/14*      (2006.01)
*H03B 17/00*     (2006.01)

(52) U.S. Cl.
CPC ............... *H03L 7/26* (2013.01); *G04F 5/145* (2013.01); *H03B 17/00* (2013.01); *H03B 2200/0044* (2013.01)

(58) Field of Classification Search
CPC ............... G04F 5/145; G04F 5/14; H03L 7/26
See application file for complete search history.

(56) References Cited

U.S. PATENT DOCUMENTS 6,320,472 B1   11/2001  Vanier
6,363,091 B1    3/2002  Zhu et al.
(Continued)

FOREIGN PATENT DOCUMENTS

JP    2005-265836 A    9/2005
JP    2007-052003 A    3/2007
(Continued)

*Primary Examiner* — Ryan Johnson
(74) *Attorney, Agent, or Firm* — Harness, Dickey & Pierce, P.L.C.

(57) ABSTRACT

An atomic oscillator includes a gas cell, a semiconductor laser, and a frequency modulation signal generation section (such as a frequency transform circuit) which generates a frequency modulation signal for causing the semiconductor laser to generate frequency-modulated light including a resonance light pair (first-order sideband light pair) that causes an electromagnetically induced transparency phenomenon in metal atoms. When a modulation index of the frequency modulation signal, by which a first-order differential value of oscillation frequency deviation of the atomic oscillator becomes 0, is regarded as a first modulation index, the modulation index is within a range between a second modulation index, which is smaller than the first modulation index, with which the oscillation frequency deviation is 0 and a third modulation index, which is greater than the first modulation index, with which the oscillation frequency deviation is 0.

7 Claims, 10 Drawing Sheets

(56) References Cited

U.S. PATENT DOCUMENTS

| | | |
|---|---|---|
| 7,778,293 B2 | 8/2010 | Vanier |
| 2005/0207456 A1 | 9/2005 | Berberian et al. |
| 2007/0025187 A1 | 2/2007 | Agesawa et al. |
| 2007/0200643 A1 | 8/2007 | Dimarcq et al. |
| 2011/0051763 A1 | 3/2011 | Vanier |
| 2011/0187467 A1 | 8/2011 | Chindo |
| 2012/0235752 A1 | 9/2012 | Nishida |

FOREIGN PATENT DOCUMENTS

| | | |
|---|---|---|
| JP | 2007-530965 A | 11/2007 |
| JP | 2010-161608 A | 7/2010 |
| JP | 2011-160251 A | 8/2011 |
| JP | 2012-049230 A | 3/2012 |
| JP | 2012-191120 A | 10/2012 |
| WO | WO-2005-101141 A1 | 10/2005 |

ATOMIC OSCILLATOR, ELECTRONIC APPARATUS, MOVING OBJECT, AND MANUFACTURING METHOD OF ATOMIC OSCILLATOR

CROSS-REFERENCE TO RELATED APPLICATIONS

This application is a Continuation in Part of and claims priority to U.S. patent application Ser. No. 14/489,959 filed Sep. 18, 2014, and claims priority to Japanese Patent Application No. 2013-202238 filed Sep. 27, 2013. The disclosures of the above applications are incorporated herein by reference in their entirety.

BACKGROUND

1. Technical Field

The present invention relates to an atomic oscillator, an electronic apparatus, a moving object, and a manufacturing method of an atomic oscillator.

2. Related Art

As shown in FIG. 12, a cesium atom, which is a kind of alkali metal atom, has a ground level of $6S_{1/2}$ and two excitation levels of $6P_{1/2}$ and $6P_{3/2}$, and furthermore, the respective levels of $6S_{1/2}$, $6P_{1/2}$, and $6P_{3/2}$ have ultrafine structures with a plurality of split energy levels. Specifically, $6S_{1/2}$ has two ground levels F=3 and 4, $6P_{1/2}$ has two excitation levels F'=3 and 4, and $6P_{3/2}$ has four excitation levels F'=2, 3, 4, and 5.

For example, a cesium atom in a ground level F of $6S_{1/2}$=3 can shift to one of the excitation levels F' of $6P_{3/2}$=2, 3, and 4, by absorbing a D2 beam while the cesium atom cannot shift to the excitation level F'=5. A cesium atom in the ground level F of $6S_{1/2}$=4 can shift to one of the excitation levels F' of $6P_{3/2}$=3, 4, and 5 by absorbing the D2 beam while the cesium atom cannot shift to the excitation level F'=2. This is based on a transition selection rule on an assumption of electric dipole transition. In contrast, a cesium atom in one of excitation levels F' of $6P_{3/2}$=3 and 4 emits the D2 beam and can shift to a ground level F of $6S_{1/2}$=3 or 4 (either an original ground level or the other ground level). Here, the three levels (the two ground levels and one excitation level) consisting of the two ground levels F of $6P_{1/2}$=3 and 4 and one of the excitation levels F' of $6P_{3/2}$=3 and 4 are referred to as Λ-type three levels since Λ-type transition by absorption and light emission of the D2 beam is possible. Similarly, the three levels consisting of two ground levels F of $6S_{1/2}$=3 and 4 and one of the excitation levels F' of $6P_{1/2}$=3 and 4 can realize the Λ-type transition by absorption and light emission of a D1 beam and therefore forms the Λ-type three levels.

On the other hand, a cesium atom in an excitation level F' of $6P_{3/2}$=2 emits the D2 beam and always shifts to a ground level of $6S_{1/2}$=3 (original ground level), and similarly, a cesium atom in an excitation level F' of $6P_{3/2}$=5 emits the D2 beam and always shifts to a ground level F of $6S_{1/2}$=4 (original ground level). That is, the three levels consisting of the two ground levels F of $6S_{1/2}$=3 and 4 and the excitation level F' of $6P_{32}$=2 or 5 cannot realize the Λ-type transition by absorption and emission of the D2 beam and therefore do not form the Λ-type three levels. In addition, it has been known that alkali metal atoms other than the cesium atom similarly have two ground levels and an excitation level which form the Λ-type three levels.

Incidentally, if an alkali atom in the form of a gas is irradiated simultaneously with resonance light (referred to as resonance light 1) with a frequency (the number of vibrations) corresponding to an energy difference between the first ground level (the ground level F of $6S_{1/2}$=3 in the case of a cesium atom) which forms the Λ-type three levels and the excitation level (the excitation level F' of $6P_{3/2}$=4, for example, in the case of the cesium atom) and with resonance light (referred to as resonance light 2) with a frequency (the number of vibrations) corresponding to an energy difference between the second ground level (the ground level F of $6S_{1/2}$=4 in the case of the cesium atom) and the excitation level, it is known that a state where the two ground levels are overlapped, namely a quantum coherence state (dark state) is created and that an electromagnetically induced transparency (EIT) phenomenon (also referred to as a coherent population trapping (CPT)) in which excitation to the excitation level is stopped occurs. A frequency difference between a resonance light pair (the resonance light 1 and the resonance light 2) which causes the EIT phenomenon completely coincides with a frequency corresponding to an energy difference $\Delta E_{12}$ between the two ground levels of the alkali metal atom. In the case of the cesium atom, for example, a frequency corresponding to the energy difference between the two ground levels is 9.192631770 GHz, and therefore, the EIT phenomenon occurs if the cesium atom is irradiated simultaneously with two types of laser light, namely the D1 light and the D2 light with a frequency difference of 9.192631770 GHz.

Accordingly, intensity of light which penetrates through the alkali metal atom steeply changes depending on whether or not light with a frequency $\omega_1$ and light with a frequency $\omega_2$ function as the resonance light pair and the alkali metal atom causes the EIT phenomenon when the alkali metal atom in the form of a gas is irradiated simultaneously with the two light waves as shown in FIG. 13. A signal indicating intensity of transmitted light, which steeply changes, is referred to as an EIT signal (resonance signal), and a level of the EIT signal indicates a peak value when the frequency difference $\omega_1-\omega_2$ between the resonance light pair completely coincides with the frequency $\omega_{21}$ corresponding to $\Delta E_{12}$. Thus, it is possible to realize an oscillator with high accuracy by controlling a light detector so as to detect a peak top of the EIT signal, such that the frequency difference $\omega_1-\omega_2$ of the two light waves completely coincides with the frequency $\omega_{21}$ corresponding to $\Delta E_{12}$ by irradiating an atom cell (gas cell) in which the alkali metal atom in the form of gas is encapsulated with the two light waves. Such a technology relating to the atomic oscillator is disclosed in U.S. Pat. No. 6,320,472, for example.

According to an atomic oscillator of the EIT scheme in the related art, a semiconductor laser generates light, a center frequency $f_0$ of which is modulated with a modulation frequency $f_m$, by superimposing a modulation signal with the frequency $f_m$ on the bias current determining the center frequency $f_0$ (=v/λ$_0$: v represents a velocity of light, λ$_0$ represents a wavelength of light) (carrier frequency) of the light generated by the semiconductor laser and supplying the superimposed modulation signal to the semiconductor laser. The gas cell with alkali metal encapsulated therein is irradiated with the light emitted by the semiconductor laser, and light which penetrates through the gas cell is detected by a light detector. An oscillation frequency of a voltage controlled crystal oscillator (VCXO) is controlled in accordance with intensity of the light detected by the light detector, and a modulation signal with a frequency $f_m$ is generated via a Phase Locked Loop (PLL) circuit. Then, control is performed such that first-order sideband light which is emitted by the semiconductor laser, namely light with a frequency $f_0+f_m$ and light with a frequency $f_0-f_m$ forms a resonance light pair. By such control, a frequency deviation of an output signal of the voltage controlled crystal oscillator (VCXO) is significantly reduced, and it is possible to realize an oscillator with high frequency accuracy. Since frequency accuracy (short-term stability) is further enhanced as S/N of an EIT signal increases, intensity (amplitude) of the modulation signal is determined such that intensity of first-order sideband light is maximized, in the related art. FIG. 14 shows an example of a frequency spectrum of light emitted by a semiconductor laser in the related art. In FIG. 14, the horizontal axis represents a frequency of the light, and the vertical axis represents intensity of the light.

In contrast, a Stark shift effect in which original energy levels of atoms slightly vary due to an interaction between laser light and the atoms has been known. Since a frequency of the EIT signal at a peak position shifts, due to the Stark shift, a frequency of an atomic oscillator also shifts. If intensity of light which is incident on alkali metal atoms changes due to time degradation of components such as a semiconductor laser or a gas cell, the shift amount of frequency at the EIT peak position due to the Stark shift also varies. However, only an improvement in S/N of the EIT signal is taken into consideration in the case of the method in the related art, and therefore, there is a problem in that variations in the shift amount of frequency at the EIT peak position is relatively great and long-term stability of the atomic oscillator deteriorates.

SUMMARY

An advantage of some aspects of the invention is to provide an atomic oscillator capable of enhancing long-term stability as compared with that in the related art, an electronic apparatus and a moving object, in each of which the atomic oscillator is used, and a manufacturing method of the atomic oscillator.

An aspect of the invention can be implemented as the following forms or application examples.

Application Example 1

This application example is directed to an atomic oscillator including: a cell which encapsulates metal atoms therein; a light source which generates light for irradiation of the cell; and a frequency modulation signal generation section which generates a frequency modulation signal for causing the light source to generate frequency-modulated light including a resonance light pair that causes an electromagnetically induced transparency phenomenon in the metal atoms, in which the resonance light pair is a first-order sideband light pair included in the light generated by the light source, wherein when a modulation index is changed from a lower side to a higher side, a modulation index at a timing when the first-order sideband light is maximized for the first time may be represented as a first value, and a modulation index at a timing when intensity of light with a center frequency, which is included in the light generated by the light source, becomes equal to or higher than intensity of the first-order sideband light for the first time after decreasing to be lower than the intensity of the first-order sideband light for the first time may be represented as a second value, and in which intensity of the frequency modulation signal is set such that the modulation index is higher than the first value and lower than the second value.

In the atomic oscillator according to the application example, the intensity of the frequency modulation signal is set such that the amount of variation in the intensity of the light with the center frequency when the intensity of the frequency modulation signal (the modulation index of the frequency modulation) varies is smaller than that in the related art, in consideration of a fact that the variation in the intensity of the light with the center frequency is dominant in variations in a frequency difference (Stark shift) of the resonance light pair. Therefore, according to the atomic oscillator of the application example, it is possible to reduce the amount of variation in the oscillation frequency caused by the Stark shift which occurs due to time-dependent changes in components and to thereby enhance long-term stability as compared with that in the related art.

In addition, the intensity of the frequency modulation signal varies in accordance with a temperature property of a circuit part when a surrounding environment temperature varies. However, according to the atomic oscillator of the application example, the intensity of the frequency modulation signal is set in a range in which the amount of variation decreases as compared with that in the related art, and therefore, it is possible to reduce the amount of variation in the oscillation frequency due to the Stark shift and to enhance the frequency and temperature properties as compared with those in the related art.

Application Example 2

In the atomic oscillator according to the application example described above, when the modulation index is changed from the lower side to the higher side, a modulation index at a timing when the intensity of the light with the center frequency becomes equal to intensity of second-order sideband light, which is included in the light generated by the light source, for the first time may be represented as a third value, and the intensity of the frequency modulation signal may be set such that the modulation index is higher than the third value.

Application Example 3

In the atomic oscillator according to the application example described above, when the modulation index is changed from the lower side to the higher side, a modulation index at a timing when the intensity of the light with the center frequency becomes equal to intensity of third-order sideband light, which is included in the light generated by the light source, for the first time may be represented as a fourth value, and the intensity of the frequency modulation signal may be set such that the modulation index is higher than the fourth value.

Application Example 4

In the atomic oscillator according to the application example described above, when the modulation index is changed from the lower side to the higher side, a modulation index at a timing when the intensity of the first-order sideband light becomes equal to or higher than the intensity of the third-order sideband light for the first time after increasing to be higher than the intensity of the third-order sideband light, which is included in the light generated by the light source, for the first time may be represented as a fifth value, and the intensity of the frequency modulation signal may be set such that the modulation index is lower than the fifth value.

Application Example 5

In the atomic oscillator according to the application example described above, when the modulation index is changed from the lower side to the higher side, a modulation index at a timing when the intensity of the first-order sideband light becomes equal to the intensity of the second-order sideband light for the first time after increasing to be higher than the intensity of the second-order sideband light, which is included in the light generated by the light source, for the first time may be represented as a sixth value, and the intensity of the frequency modulation signal may be set such that the modulation index is lower than the sixth value.

According to the atomic oscillators of these application examples, the intensity of the frequency modulation signal is set such that the amount of variation in the intensity of the light with the center frequency when the intensity of the frequency modulation signal (the modulation index of the frequency modulation) varies further decreases, and therefore, it is possible to further enhance the long-term stability and the frequency and temperature properties.

Application Example 6

In the atomic oscillator according to the application example described above, the intensity of the frequency modulation signal may be set such that the intensity of the light with the center frequency is minimized in a modulation index between the first value and the second value.

According to the atomic oscillator of this application example, the intensity of the frequency modulation signal is set such that the intensity of the light with the center frequency when the intensity of the frequency modulation signal (the modulation index of the frequency modulation) varies is minimized, and therefore, it is possible to significantly enhance the long-term stability and the frequency and temperature properties.

Application Example 7

This application example is directed to an electronic apparatus including any one of the above atomic oscillators.

Application Example 8

This application example is directed to a moving object including any one of the above atomic oscillators.

According to the electronic apparatus and the moving object in these application examples, it is possible to maintain high reliability for a long period of time since the atomic oscillator with high long-term stability and high frequency and temperature properties is provided therein.

Application Example 9

This application example is directed to a manufacturing method of an atomic oscillator, the atomic oscillator including a cell which encapsulates metal atoms therein, a light source which generates light for irradiation of the cell, a light detecting section which detects light transmitted by the cell, and a frequency modulation signal generation section which generates a frequency modulation signal for causing the light source to generate frequency-modulated light including a resonance light pair that causes an electromagnetically induced transparency phenomenon in the metal atoms, based on intensity of the light detected by the light detecting section, the resonance light pair being a first-order sideband light pair included in the light generated by the light source, the method including: inputting the frequency modulation signal to the light source while changing the intensity thereof and acquiring a relationship between the intensity of the frequency modulation signal and an oscillation frequency based on an output signal of the light detecting section; and adjusting the intensity of the frequency modulation signal such that intensity of light with a center frequency, which is included in the light generated by the light source, decreases to be lower than intensity of the first-order sideband light, based on the relationship between the intensity of the frequency modulation signal and the oscillation frequency.

For example, when the modulation index is changed from the lower side to the higher side in adjusting the intensity of the frequency modulation signal, a modulation index at a timing when first-order sideband light is maximized for the first time may be represented as a first value, a modulation index at a timing when intensity of light with a center frequency included in the light generated by the light source becomes equal to or higher than the intensity of the first-order sideband light for the first time after decreasing to be lower than the intensity of the first-order sideband light for the first time may be represented as a second value, and the intensity of the frequency modulation signal may be adjusted such that the modulation index is higher than the first value and is smaller than the second value.

According to the manufacturing method of an atomic oscillator of the application example, it is possible to omit the time and effort for acquiring the frequency spectrum of the light emitted by the light source and to relatively easily adjust the intensity of the frequency modulation signal by acquiring the relationship between the intensity of the frequency modulation signal and the oscillation frequency.

Application Example 10

In the manufacturing method of an atomic oscillator according to the application examples described above, in the adjusting of the intensity of the frequency modulation signal, sensitivity of the oscillation frequency with respect to the intensity of the frequency modulation signal may be acquired based on the relationship between the intensity of the frequency modulation signal and the oscillation frequency, and the intensity of the frequency modulation signal may be adjusted so as to substantially minimize the sensitivity.

According to the manufacturing method of an atomic oscillator of this application example, the sensitivity of the oscillation frequency with respect to the intensity of the frequency modulation signal is acquired, and the intensity of the frequency modulation signal is adjusted such that the sensitivity decreases. Therefore, it is possible to reliably reduce the amount of variation in the oscillation frequency due to the Stark shift caused by time-dependent changes in components and to manufacture an atomic oscillator with higher long-term stability as compared with that in the related art.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a detailed description will be given of preferred embodiments of the invention with reference to the drawings. In addition, the embodiments described below are not intended to unreasonably limit content of the invention described in the appended claims. In addition, all the constituents described below are not necessarily essential constituent requirements of the invention.

1. ATOMIC OSCILLATOR

Configuration of Atomic Oscillator

Figure 1:
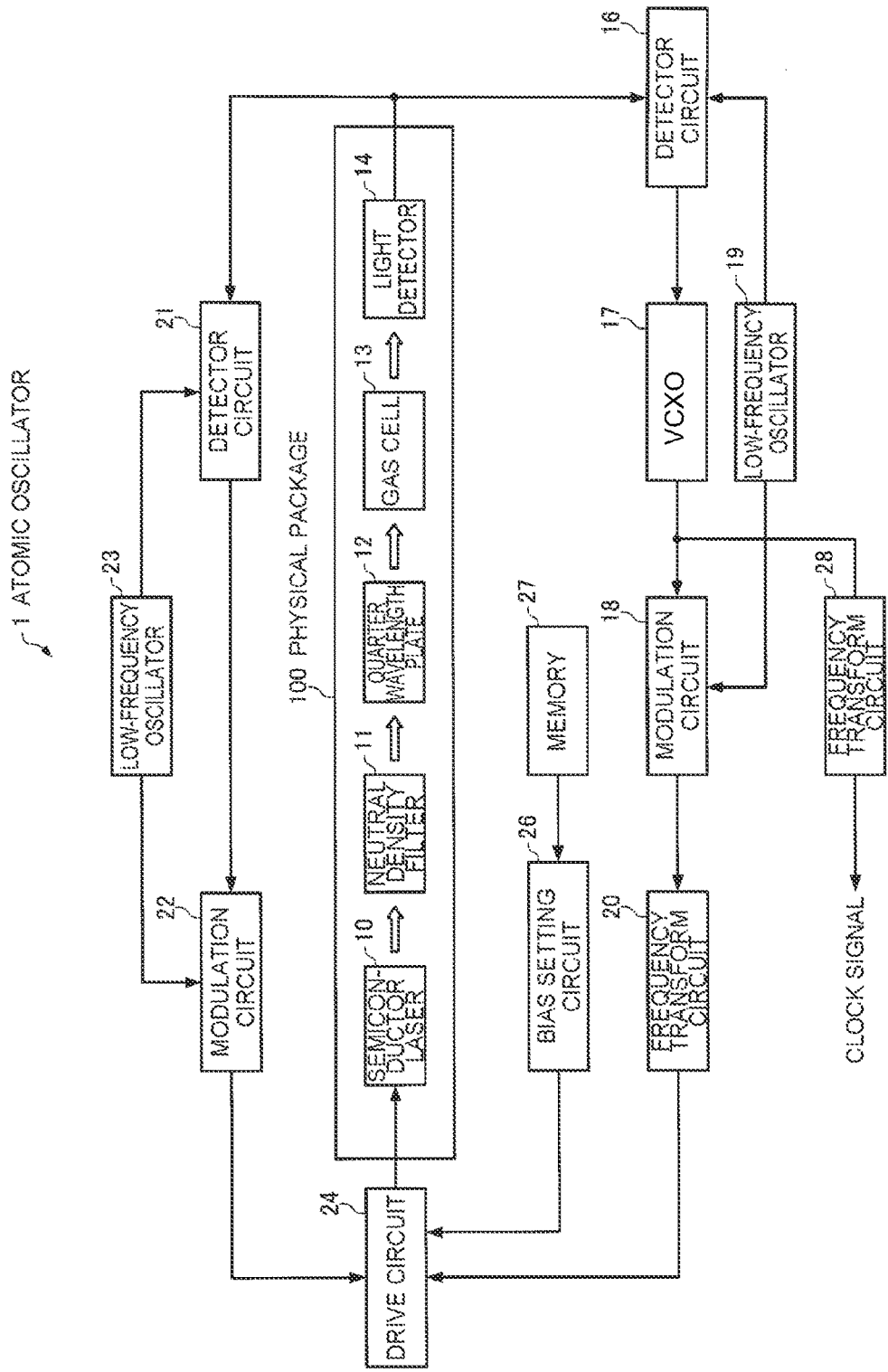
FIG. 1 is a diagram showing a configuration example of an atomic oscillator according to an embodiment.

FIG. 1 is a diagram showing a configuration example of an atomic oscillator according to an embodiment. As shown in FIG. 1, an atomic oscillator 1 according to the first embodiment includes a semiconductor laser 10, a neutral density filter (ND filter) 11, a quarter wavelength plate 12, a gas cell 13, a light detector 14, a detector circuit 16, a voltage controlled crystal oscillator (VCXO) 17, a modulation circuit 18, a low-frequency oscillator 19, a frequency transform circuit 20, a detector circuit 21, a modulation circuit 22, a low-frequency oscillator 23, a drive circuit 24, a bias setting circuit 26, a memory 27, and a frequency transform circuit 28. In addition, the atomic oscillator 1 according to the embodiment may have a configuration in which a part of the constituents (respective units) in FIG. 1 is appropriately omitted or changed or a configuration in which other constituents are added thereto.

The semiconductor laser 10 is a surface emitting laser such as a vertical cavity surface emitting laser (VCSEL) or an edge emitting laser, and light generated by the semiconductor laser 10 is incident on the neutral density filter 11.

The neutral density filter 11 allows only a part of the light emitted by the semiconductor laser 10 to penetrate therethrough, and the light which penetrates through the neutral density filter 11 is incident on the quarter wavelength plate 12.

The quarter wavelength plate 12 transforms the incident light into σ+ circularly-polarized light and allows the σ+ circularly-polarized light to penetrate therethrough, and the light which penetrates through the quarter wavelength plate 12 is incident on the gas cell 13.

The gas cell 13 is configured such that buffer gas such as neon (Ne) or argon (Ar) is encapsulated along with alkali metal atoms (sodium (Na) atoms, rubidium (Rb) atoms, cesium (Cs) atoms, or the like) in the form of a gas in a container made of a transparent member such as glass. A part of the light which is incident on the gas cell 13 penetrates through the gas cell 13 and is incident on the light detector 14.

The light detector 14 detects the light which penetrates through the gas cell 13, and outputs a detection signal in accordance with intensity of the detected light. The light detector 14 can be implemented by using a photo diode (PD) which outputs a detection signal in accordance with the intensity of received light, for example. The output signal of the light detector 14 is input to the detector circuit 16 and the detector circuit 21.

The semiconductor laser 10, the neutral density filter 11, the quarter wavelength plate 12, the gas cell 13, and the light detector 14 are accommodated in a single case body and configure a physical package 100.

The detector circuit 16 detects the output signal from the light detector 14 by using an oscillation signal from the low-frequency oscillator 19 which oscillates at a low frequency of about several Hz to about several hundred Hz. Then, an oscillation frequency of the voltage controlled crystal oscillator (VCXO) 17 is finely adjusted in accordance with a magnitude of the output signal of the detector circuit 16. The voltage controlled crystal oscillator (VCXO) 17 oscillates at a frequency from about several MHz to about several tens MHz.

The modulation circuit 18 modulates the output signal from the voltage controlled crystal oscillator (VCXO) 17 by using the oscillation signal of the low-frequency oscillator 19 (which is the same signal as the oscillation signal supplied to the detector circuit 16) as a modulation signal in order to enable detection by the detector circuit 16. The modulation circuit 18 can be implemented by a frequency mixer (mixer), a frequency modulation (FM) circuit, an amplitude modulation (AM) circuit, or the like.

Figure 2:
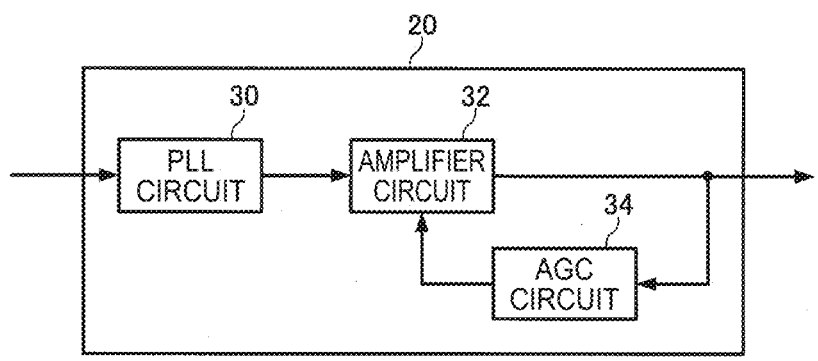
FIG. 2 is a diagram showing a configuration example of a frequency transform circuit.

The frequency transform circuit 20 frequency-transforms the output signal from the modulation circuit 18 into a signal with a half frequency of the frequency $\omega_{21}$ corresponding to the energy difference $\Delta E_{12}$ between the two ground levels of the alkali metal atoms, controls amplitude of the frequency-transformed signal to be constant, and outputs the signal to the drive circuit 24. The frequency transform circuit 20 can be implemented by using a phase locked loop (PLL) circuit 30, an amplifier circuit 32 with a variable gain, and an automatic gain control (AGC) circuit 34 as shown in FIG. 2, for example.

The detector circuit 21 detects the output signal from the light detector 14 by using the oscillation signal of the low-frequency oscillator 23 which oscillates at a low frequency of about several Hz to about several hundred Hz.

The modulation circuit 22 modulates the output signal from the detector circuit 21 by using the oscillation signal of the low-frequency oscillator 23 (the same signal as the oscillation signal to be supplied to the detector circuit 21) as a modulation signal and outputs the modulated signal to the drive circuit 24 in order to enable detection by the detector circuit 21. The modulation circuit 22 can be implemented by using a frequency mixer (mixer), a frequency modulation (FM) circuit, an amplitude modulation (AM) circuit, and the like.

The bias setting circuit 26 performs processing of setting a bias current for the semiconductor laser 10 (processing of setting a center wavelength (center frequency (carrier frequency)) of the light generated by the semiconductor laser 10) via the drive circuit 24 in accordance with setting information stored on the memory 27.

The memory 27 is a non-volatile memory and stores bias current setting information for the semiconductor laser 10 and the like thereon. The memory 27 can be implemented by using a flash memory such as a metal-oxide-nitride-oxide-silicon (MONOS) memory, an electrically erasable programmable read-only memory (EEPROM), or the like.

The drive circuit 24 sets the bias current for the semiconductor laser 10, finely adjusts the bias current in accordance with the output signal from the modulation circuit 22, and supplies the finely adjusted bias current to the semiconductor laser 10. That is, a center wavelength $\lambda_0$ (center frequency $f_0$) of the light generated by the semiconductor laser 10 is finely adjusted by a feedback loop (first feedback loop) passing through the semiconductor laser 10, the neutral density filter 11, the quarter wavelength plate 12, the gas cell 13, the light detector 14, the detector circuit 21, the modulation circuit 22, and the drive circuit 24.

The drive circuit 24 further superimposes a current (modulation current) of an output frequency component (modulation frequency $f_m$) of the frequency transform circuit 20 on the bias current and supplies the superimposed current to the semiconductor laser 10. The frequency modulation is achieved by the modulation current, and the semiconductor laser 10 generates light including light with a center frequency $f_0$ (center wavelength $\lambda_0$), light with a frequency $f_0 \pm f_m$ (first-order sideband light), light with a frequency $f_0 \pm 2f_m$ (second-order sideband light), light with a frequency $f_0 \pm 3f_m$ (third-order sideband light), and the like.

According to the embodiment, fine adjustment is made by a feedback loop (second feedback loop) which passes through the semiconductor laser 10, the neutral density filter 11, the quarter wavelength plate 12, the gas cell 13, the light detector 14, the detector circuit 16, the voltage controlled crystal oscillator (VCXO) 17, the modulation circuit 18, the frequency transform circuit 20, and the drive circuit 24 such that the light with the frequency $f_0 + f_m$ and the light with the frequency $f_0 - f_m$ (first-order sideband light pair) function as the resonance light pair which causes the EIT phenomenon in the alkali metal atoms encapsulated in the gas cell 13. Specifically, feedback control is made by the second feedback loop such that a frequency difference ($=2f_m$) between the light with the frequency $f_0 + f_m$ and the light with the frequency $f_0 - f_m$ completely coincides with the frequency $\omega_{21}$ corresponding to the energy difference $\Delta E_{12}$ between the two ground levels of the alkali metal atoms.

By utilizing the EIT phenomenon of the alkali metal atoms as described above, the output signal from the frequency transform circuit 20 and the output signal from the voltage controlled crystal oscillator (VCXO) 17 included in the second feedback loop are stabilized at constant frequencies.

The frequency transform circuit 28 frequency-transforms the output signal from the voltage controlled crystal oscillator (VCXO) 17 and generates a clock signal with a desired frequency (10.00 . . . MHz, for example). The clock signal is externally output. The frequency transform circuit 20 can be implemented by a direct digital synthesizer (DDS), for example.

The atomic oscillator 1 with the configuration as described above causes significantly small deviations in oscillation frequency and can realize high short-term stability.

In contrast, if the intensity of the light which is incident on the alkali metal atoms varies due to time-dependent changes in the component such as the semiconductor laser 10, the neutral density filter 11, the quarter wavelength plate 12, the gas cell 13, and the like, the phenomenon (Stark shift) where $\omega_{21}$ varies occurs, and therefore, the oscillation frequency varies over time. According to the embodiment, the amount of variation in the oscillation frequency is made to decrease as compared with that in the related art, and long-term stability is enhanced as will be described below.

In consideration of the Stark shift, $\omega_{21}$ is approximated by the following Equation (1).

$$\omega_{21} = \omega_{210} + \frac{\Omega_0^2}{\omega_{210}} + \frac{\Omega_{+1}^2 + \Omega_{-1}^2}{4\omega_{210}} - \sum_{k=2}^{n} \left[ \frac{\Omega_{+k}^2 + \Omega_{-k}^2}{2(k-1)\omega_{210}} - \frac{\Omega_{+k}^2 + \Omega_{-k}^2}{2(k+1)\omega_{210}} \right] \quad (1)$$

Here, $\omega_{210}$ represents a frequency corresponding to $\Delta E_{12}$ when no light is incident on the alkali metal atoms. Incidentally, $\Omega$ is a Rabi frequency, and a square of $\Omega$ is proportional to light intensity. Thus, $\Omega$ will be described as the light intensity in the following description of this article in consideration of simplicity. $\Omega_0$ represents intensity (incident amount) of zero-order (center frequency) light, $\Omega_{+1}$ and $\Omega_{-1}$ represent intensity (incident amounts) of first-order sideband light on the upper and lower sides, respectively, and $\Omega_{+2}$ and $\Omega_{-2}$ represent intensity (incident amounts) of second-order sideband light on the upper and lower sides, respectively.

In Equation (1), the second term on the right side represents a degree of a variation in frequency due to the intensity of the light with the center frequency, the third and fourth terms on the right side represent a degree of a variation in frequency due to the intensity of the first-order sideband light, and the fifth and sixth terms on the right side represent a degree of a variation in frequency due to the intensity of the second-order sideband light. Since the third term and the fourth term on the right side have opposite symbols, the degree of the variation in frequency due to the intensity of the first-order sideband light is relatively low. Since the fifth term and the sixth term on the right side have opposite symbols in the same manner, the degree of the variation in frequency due to the intensity of the second-order sideband light is relatively low. For this reason, the degree of the variation due to the intensity $\Omega_0$ of the light with the center frequency is dominant in the variation in $\omega_{21}$. Thus, it is effective to perform the frequency modulation so as to reduce the amount of variation in $\Omega_0$, that is, to set the intensity of the frequency modulation signal to a value which reduces the amount of variation in $\Omega_0$ with respect to the variation in the intensity of the frequency modulation signal, in order to enhance the long-term stability.

The emitted light after the frequency modulation with the frequency modulation signal with a frequency $f_m$ by using an ideal laser as the semiconductor laser 10 is represented by the following Equation (2).

$$A_{FM} = A_0[J_0(m)\sin(2\pi f_0 t) + \qquad (2)$$
$$J_1(m)\{\sin 2\pi(f_0+f_m)t - \sin 2\pi(f_0-f_m)t\} +$$
$$J_2(m)\{\sin 2\pi(f_0+2f_m)t + \sin 2\pi(f_0-2f_m)t\} +$$
$$J_3(m)\{\sin 2\pi(f_0+3f_m)t - \sin 2\pi(f_0-3f_m)t\} + \ldots]$$
$$= A_0\left[J_0(m)\sin(2\pi f_0 t) + \sum_{n=1}^{\infty} J_n(m)\sin 2\pi(f_0+nf_m)t + \sum_{n=1}^{\infty}(-1)^n J_n(m)\sin 2\pi(f_0-nf_m)t\right]$$

Here, $A_0$ represents intensity of the light (frequency $f_0$) emitted by the semiconductor laser 10, which is not frequency-modulated, and $J_n(m)$ represents a Bessel function (n=0, 1, 2, 3 . . . ). In addition, m represents a modulation index which is proportional to the intensity (amplitude) of the frequency modulation signal.

In Equation (2), $A_0 \times J_0(m)$ corresponds to the intensity of the zero-order (center frequency) light, $A_0 \times J_1(m)$ corresponds to the intensity of the first-order sideband light, $A_0 \times J_2(m)$ corresponds to the intensity of the second-order sideband light, and $A_0 \times J_3(m)$ corresponds to the intensity of the third-order sideband light.

Figure 3:
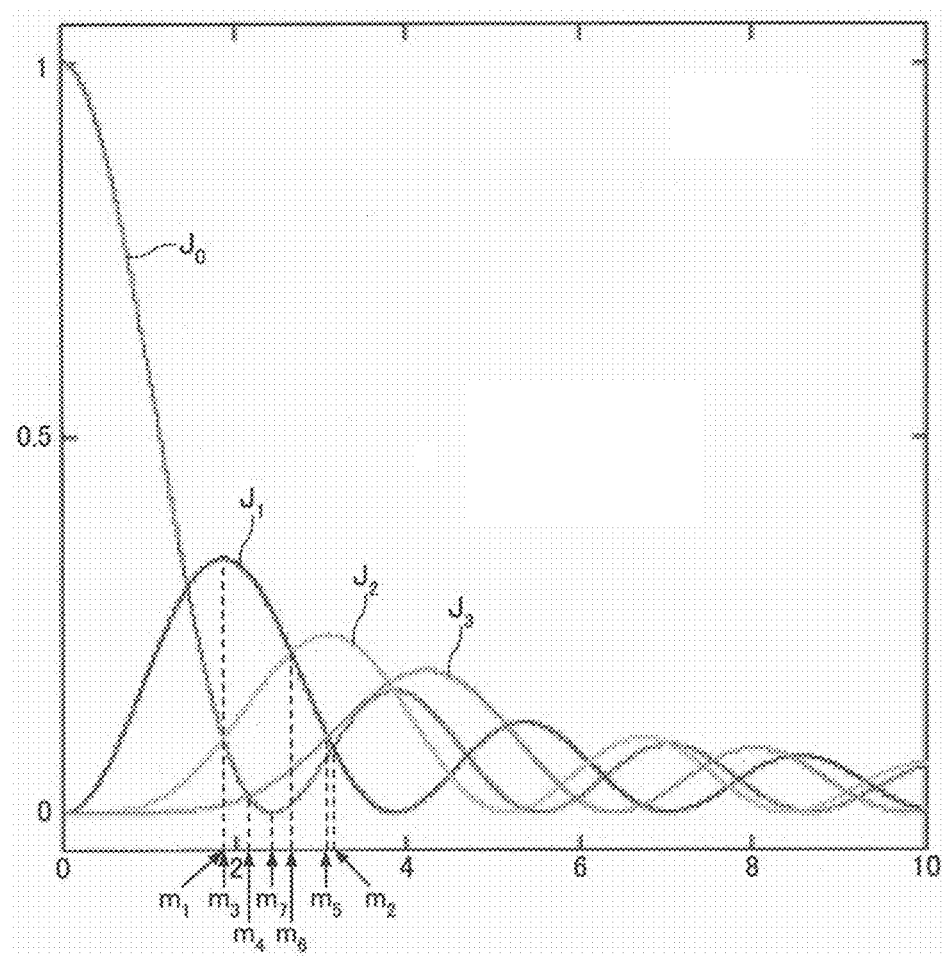
FIG. 3 is a diagram showing Bessel functions.

FIG. 3 is a diagram showing the respective Bessel functions of $J_0$, $J_1$, $J_2$, and $J_3$. In FIG. 3, the horizontal axis represents a modulation index m, and the vertical axis represents a value of each Bessel function.

In FIG. 3, $m_1$ represents a value of a modulation index m (first value) at a timing when the intensity of the first-order sideband light is maximized for the first time (in other words, at a timing when $J_1$ is maximized for the first time) when the modulation index m is changed from the lower side to the higher side. In addition, $m_2$ represents a value of a modulation index m (second value) when the intensity of the light with the center frequency becomes equal to or higher than the intensity of the first-order sideband light for the first time after decreasing to be lower than the intensity of the first-order sideband light for the first time (in other words, at a timing when $J_0=J_1$ is satisfied for the first time after $J_0<J_1$ is satisfied for the first time) when the modulation index m is changed from the lower side to the higher side. Setting is made such that the modulation index m coincides with $m_1$ in the related art, inclination of $J_0$ is relatively large in the setting, and therefore, the amount of variation in the oscillation frequency due to the Stark shift when the intensity of the frequency modulation signal varies is also large.

According to this embodiment, the intensity of the frequency modulation signal is set at least within a range in which the modulation index m is higher than $m_1$ and is lower than $m_2$. Since such a setting range brings about over modulation as compared with the related art, and the inclination of $J_0$ is small, it is possible to reduce the amount of variation in the oscillation frequency due to the Stark shift.

In FIG. 3, $m_3$ represents a value of a modulation index m (third value) at a timing when the intensity of the light with the center frequency becomes equal to the intensity of the second-order sideband light for the first time (in other words, at a timing when $J_0=J_2$ is satisfied for the first time) when the modulation index m is changed from the lower side to the higher side. In addition, $m_4$ represents a value of a modulation index m (fourth value) at a timing when the intensity of the light with the center frequency becomes equal to the intensity of the third-order sideband light for the first time (in other words, at a timing when $J_0=J_3$ is satisfied for the first time) when the modulation index m is changed from the lower side to the higher side.

In the embodiment, it is preferable to set the intensity of the frequency modulation signal within a range in which the modulation index m is higher than $m_3$ or to set the intensity of the frequency modulation signal within a range in which the modulation index m is higher than $m_4$. Since the inclination of $J_0$ becomes smaller in any of the setting ranges, it is possible to further reduce the amount of variation in the oscillation frequency due to the Stark shift.

In FIG. 3, $m_5$ represents a value of a modulation index m (fifth value) at a timing when the intensity of the first-order sideband light becomes equal to or higher than the intensity of the third-order sideband light for the first time after increasing to be higher than the intensity of the third-order sideband light for the first time (in other words, at a timing when $J_1=J_3$ is satisfied for the first time after $J_1>J_3$ is satisfied for the first time) when the modulation index m is changed from the lower side to the higher side. In addition, $m_6$ represents a value of a modulation index m (sixth value) at a timing when the intensity of the first-order sideband light becomes equal to the intensity of the second-order sideband light for the first time after increasing to be higher than the intensity of the second-order sideband light for the first time (in other words, at a timing when $J_1=J_2$ is satisfied for the first time after $J_1>J_2$ is satisfied for the first time) when the modulation index m is changed from the lower side to the higher side.

In the embodiment, it is preferable to set the intensity of the frequency modulation signal within a range in which the modulation index m is lower than $m_5$ or to set the intensity of the frequency modulation signal within a range in which the modulation index m is lower than $m_6$. Since the inclination of $J_0$ is small in any of the setting ranges, it is possible to further reduce the amount of variation in the oscillation frequency due to the Stark shift.

In FIG. 3, $m_7$ is a value of a modulation index m at a timing when the intensity of the light with the center frequency is minimized in the modulation index m between $m_1$ and $m_2$ (in other words, at a timing when $J_0$ is minimized in the modulation index m between $m_1$ and $m_2$).

In this embodiment, it is further preferable to set the intensity of the frequency modulation signal such that the modulation index m is $m_7$ or is in the vicinity of $m_7$. The inclination of $J_0$ is substantially zero in such setting, and it is possible to significantly reduce the amount of variation in the oscillation frequency due to the Stark shift.

Figure 4:
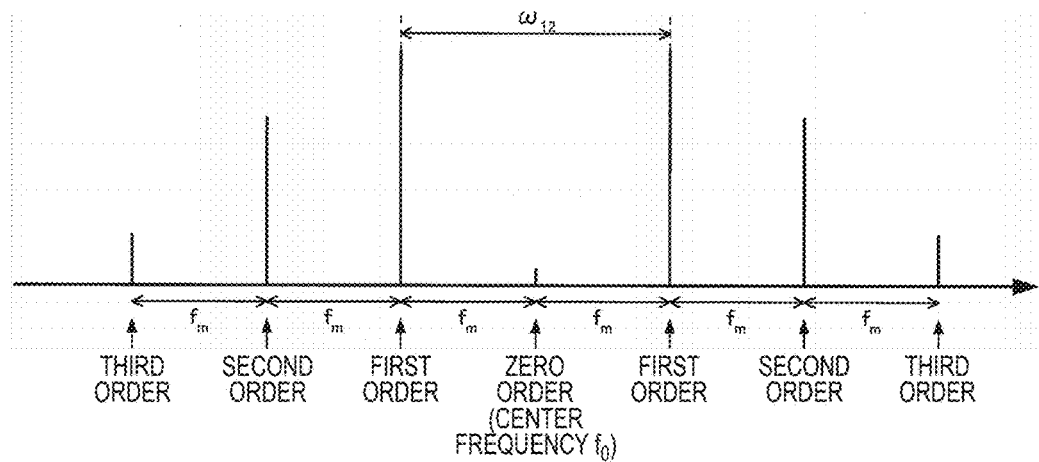
FIG. 4 is an outline diagram showing a frequency spectrum of emitted light of a semiconductor laser according to the embodiment.

FIG. 4 shows an example of a frequency spectrum of the light emitted by the semiconductor laser 10. In FIG. 4, the horizontal axis represents a frequency of the light, and the vertical axis represents intensity of the light. In the example of FIG. 4, the frequency spectrum in a case where the intensity of the frequency modulation signal is set such that the modulation index m is in the vicinity of $m_7$ is shown. As shown in FIG. 4, the intensity of the light with the center frequency $f_0$ is suppressed to a low level.

According to the atomic oscillator 1 of the embodiment, the intensity of the output signal (frequency modulation signal) of the frequency transform circuit 20 is set such that the amount of variation in the intensity of the light with the center frequency $f_0$ when the modulation index m varies becomes smaller than that in the related art, in consideration of the fact that the variation in the intensity of the light with the center frequency $f_0$ is dominant in the variations in the frequency difference $\omega_{21}$ of the resonance light pair (Stark shift) as described above. Therefore, according to the atomic oscillator 1 of the embodiment, it is possible to reduce the amount of variation in the oscillation frequency due to the Stark shift that is caused by time-dependent changes in the components and to thereby enhance the long-term stability as compared with that in the related art.

In addition, the intensity of the output signal (frequency modulation signal) of the frequency transform circuit 20 varies in accordance with a temperature property of the circuit part when a surrounding environment temperature varies. However, according to the atomic oscillator 1 of the embodiment, the intensity of the frequency modulation signal is set within the range in which the amount of variation thereof decreases as compared with that in the related art, and therefore, it is possible to reduce the amount of variation in the oscillation frequency due to the Stark shift and to enhance the frequency and temperature properties as compared with those in the related art.

In FIG. 1, the constituents (circuits) other than the physical package 100 may be implemented by a chip of integrated circuit (IC) or by a plurality of IC chips, for example.

In FIG. 1, the semiconductor laser 10, the gas cell 13, and the light detector 14 correspond to the "light source", the "cell", and the "light detecting section", respectively according to the invention. In addition, the circuit configured of the detector circuit 16, the voltage controlled crystal oscillator (VCXO) 17, the modulation circuit 18, the low-frequency oscillator 19, and the frequency transform circuit 20 corresponds to the "modulation signal generation section" according to the invention.

Manufacturing Method of Atomic Oscillator

Figure 5:
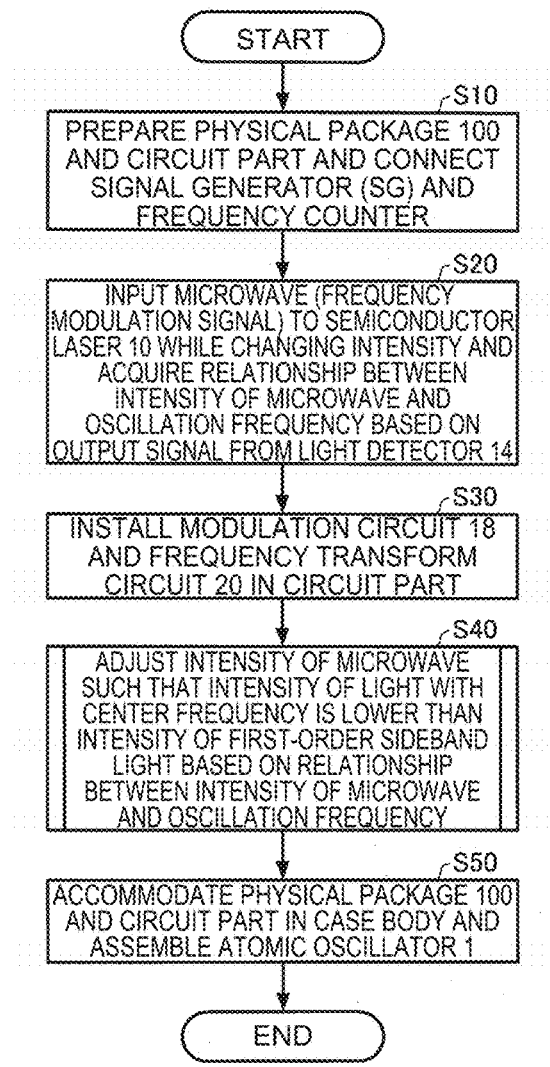
FIG. 5 is a flowchart showing an example of a manufacturing method of the atomic oscillator according to the embodiment.

FIG. 5 is a flowchart showing an example of a manufacturing method of the atomic oscillator 1 according to the embodiment.

First, the physical package 100 and the circuit part shown in FIG. 1 are prepared, and a signal generator (SG) 40 and a frequency counter 50 are connected to each other (S10).

Figure 6:
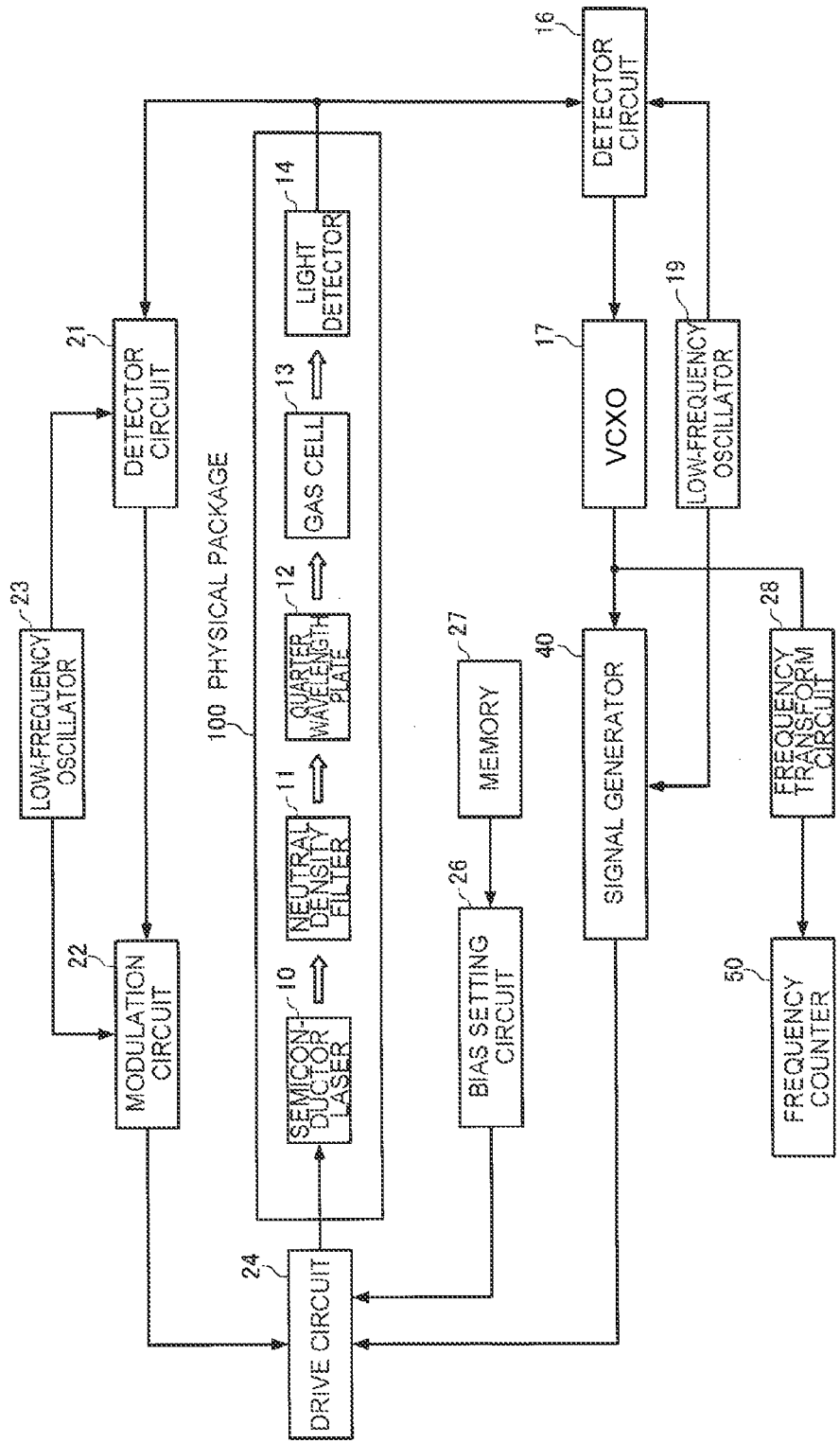
FIG. 6 is a diagram showing a connection example between a signal generator and a frequency counter.

FIG. 6 is a diagram showing a connection example between the signal generator (SG) 40 and the frequency counter 50. In the example of FIG. 6, the modulation circuit 18 and the frequency transform circuit 20 in FIG. 1 are replaced with the signal generator (SG) 40, and the signal generator (SG) 40 modulates an output signal of the voltage controlled crystal oscillator (VCXO) 17 by using the oscillation signal of the low-frequency oscillator 19 as a modulation signal, further performs frequency transform at a constant frequency transform rate to generate a microwave, and outputs the microwave to the drive circuit 24 in order to enable the detection by the detector circuit 16. The microwave functions as a frequency modulation signal for frequency modulation for the semiconductor laser 10. In addition, the frequency counter 50 measures a frequency of a clock signal output from the frequency transform circuit 28.

In addition, the frequency counter 50 may measure a frequency of the output signal from the VCXO 17 or a frequency of the output signal from the signal generator (SG) 40.

Next, a microwave (frequency modulation signal) is input to the semiconductor laser 10 while the intensity thereof is changed, and a relationship between the intensity of the microwave and the oscillation frequency is acquired based on an output signal from the light detector 14 (S20). Specifically, the relationship between the intensity of the microwave and the oscillation frequency is acquired by the signal generator (SG) 40 increasing or decreasing the voltage of the microwave by a predetermined value and by the frequency counter 50 measuring the oscillation frequency at each voltage of the microwave.

Figure 7:
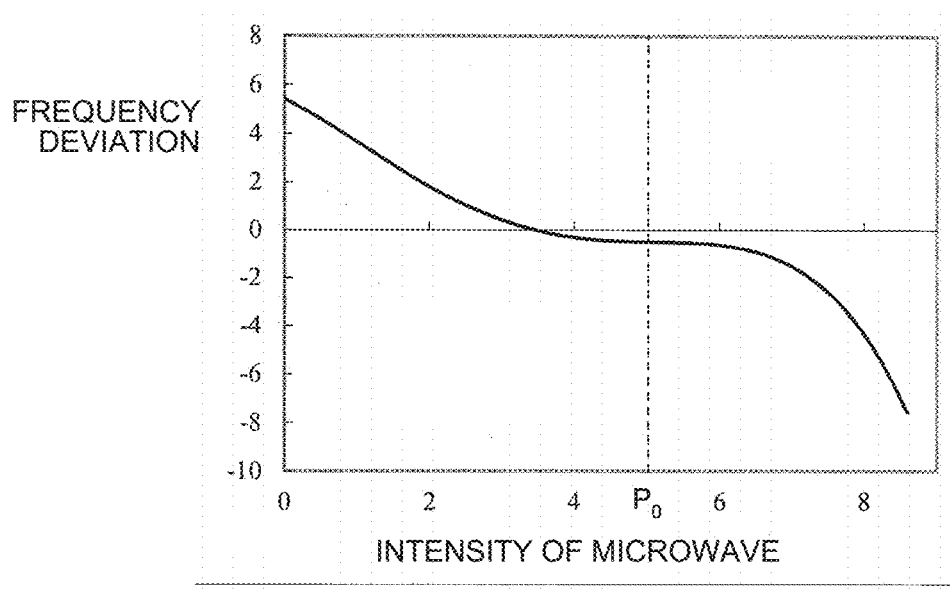
FIG. 7 is a diagram showing an example of a relationship between intensity of a microwave and an oscillation frequency.

FIG. 7 is a diagram showing an example of the relationship between the intensity of the microwave and the oscillation frequency. In FIG. 7, the horizontal axis represents intensity of the microwave, and the vertical axis represents a frequency deviation of the oscillation frequency, both of which are represented in arbitrary units. As described above, the variation depending on the intensity of the light with the center frequency is dominant in the variation in $\omega_{21}$ according to Equation (1) for the frequency difference $\omega_{21}$ of the resonance light pair in consideration of the Stark shift, and the intensity of the light with the center frequency corresponds to the first term on the right side (the term including the Bessel Function $J_0(m)$) of Equation (2) and therefore varies in accordance with the modulation index m. In addition, since the modulation index m is proportional to the intensity of the microwave, the frequency deviation of the oscillation frequency depending on the intensity of the microwave as shown in FIG. 7 has a correlation with the Bessel function $J_0(m)$ as shown in FIG. 6. Specifically, a period during which the frequency deviation simply decreases as the intensity of the microwave increases from zero to $P_0$ in FIG. 7 corresponds to a period during which $J_0(m)$ simply decreases as the modulation index increases from zero to $m_7$ in FIG. 6. In addition, a timing when the intensity of the microwave is $P_0$ and a change rate of the frequency deviation is minimized in FIG. 7 corresponds to a timing when the modulation index is $m_7$ and $J_0(m)$ is minimized in FIG. 6. Furthermore, a period during which the frequency deviation simply decreases as the intensity of the microwave increases from $P_0$ in FIG. 7 corresponds to a period during which $J_0(m)$ simply increases as the modulation index increases from $m_7$ in FIG. 6.

Next, the connection of the signal generator (SG) 40 is released, and the modulation circuit 18 and the frequency transform circuit 20 are installed (S30).

Then, the intensity of the microwave is adjusted such that the intensity of the light with the center frequency is lower than the intensity of the first-order sideband light based on the relationship between the intensity of the microwave and the oscillation frequency acquired in Step S20 (S40). When $P_0$ in FIG. 7 coincides with $m_7$ in FIG. 6, for example, in FIG. 7, a range of the intensity of the microwave corresponding to a range of the modulation index m in which $J_0(m)<J_1(m)$ in FIG. 6 is satisfied may be acquired by calculation, and the intensity of the microwave may be adjusted to any value within the range.

Finally, the physical package 100 and the circuit part are accommodated in a case body, and the atomic oscillator 1 is assembled (S50).

Figure 8:
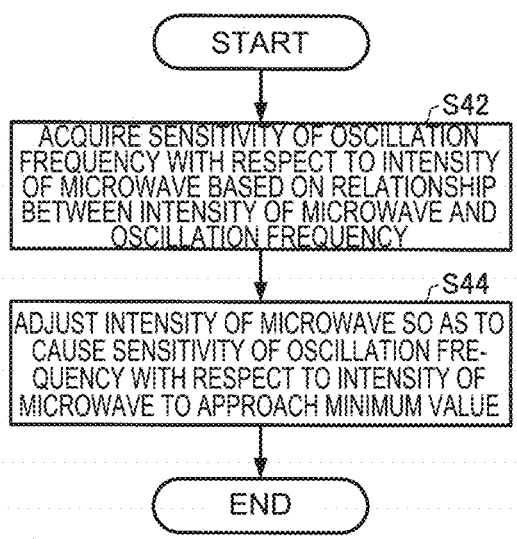
FIG. 8 is a flowchart showing an example in which Step S40 in FIG. 5 is implemented.

FIG. 8 is a flowchart showing a preferred example in which Step S40 in FIG. 5 is implemented. In the example of FIG. 8, sensitivity of the oscillation frequency with respect to the intensity of the microwave is acquired first based on the relationship between the intensity of the microwave and the oscillation frequency, which is acquired in Step S20 in FIG. 5.

Next, the intensity of the microwave is adjusted so as to cause the sensitivity of the oscillation frequency with respect to the intensity of the microwave, which is acquired in Step S42, to approach a minimum level (S44).

In Step S42, linear differentiation calculation (difference calculation) of the frequency deviation based on the intensity of the microwave is performed by using the relationship between the intensity of the microwave and the frequency deviation as shown in FIG. 7, for example, and a relationship between the intensity of the microwave and the microwave sensitivity (a first-order differential value of oscillation frequency deviation by modulation index) is acquired. The sensitivity of the microwave corresponds to the sensitivity of the oscillation frequency with respect to the intensity of the microwave.

Figure 9:
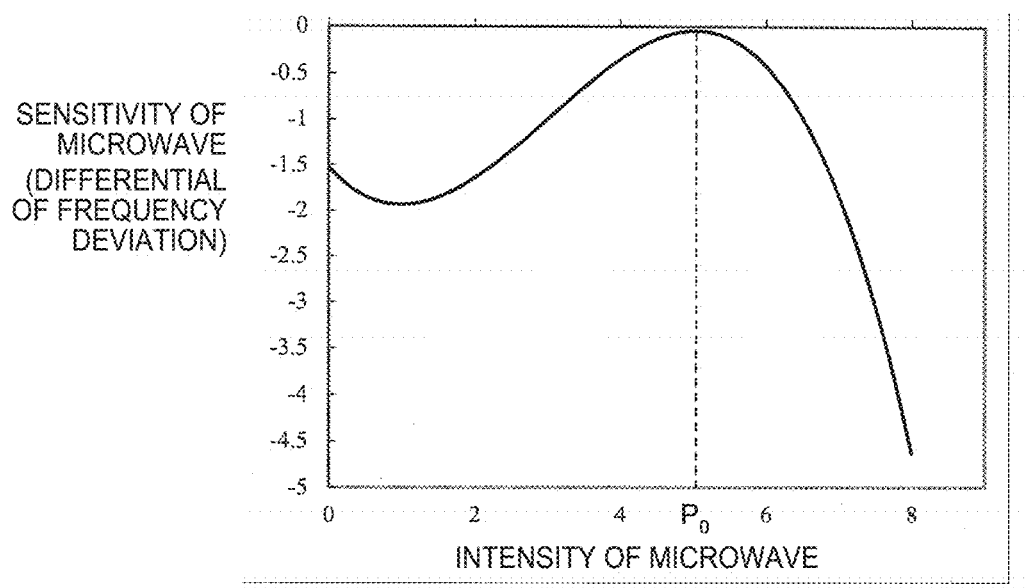
FIG. 9 is a diagram showing an example of a relationship between microwave intensity and microwave sensitivity.

FIG. 9 is a diagram showing an example of the relationship between the intensity of the microwave and the sensitivity of the microwave. In FIG. 9, the horizontal axis represents intensity of the microwave, and the vertical axis represents the sensitivity of the microwave, both of which are represented in arbitrary units. In FIG. 9, a range of the value indicating the intensity of the microwave (horizontal axis) is the same as that in FIG. 7, and a value indicating the sensitivity of the microwave (vertical axis) is a linear differential value of the frequency deviation (vertical axis) in FIG. 7 based on the intensity of the microwave. In the example of FIG. 9, an absolute value of the sensitivity of the microwave is minimized (substantially zero) when the intensity of the microwave is $P_0$. In Step S44, voltage of the output signal (frequency modulation signal) of the frequency transform circuit 20 is adjusted such that the intensity of the microwave is $P_0$ or is in the vicinity of $P_0$.

According to the manufacturing method of an atomic oscillator of the embodiment, the sensitivity of the oscillation frequency with respect to the intensity of the microwave (frequency modulation signal) is acquired, and the intensity of the output signal (frequency modulation signal) of the frequency transform circuit 20 is adjusted so as to reduce the sensitivity as described above. Therefore, it is possible to reliably reduce the amount of variation in the oscillation frequency due to the Stark shift which is caused by time-dependent changes in components and to manufacture an atomic oscillator with higher long-term stability than that in the related art.

In addition, according to the manufacturing method of an atomic oscillator of the embodiment, it is possible to eliminate the time and effort for acquiring a frequency spectrum of the light emitted by the semiconductor laser 10 and to relatively easily adjust the intensity of the frequency modulation signal by acquiring the sensitivity of the oscillation frequency with respect to the intensity of the microwave (frequency modulation signal).

Configuration 2 of Atomic Oscillator

Figure 15:
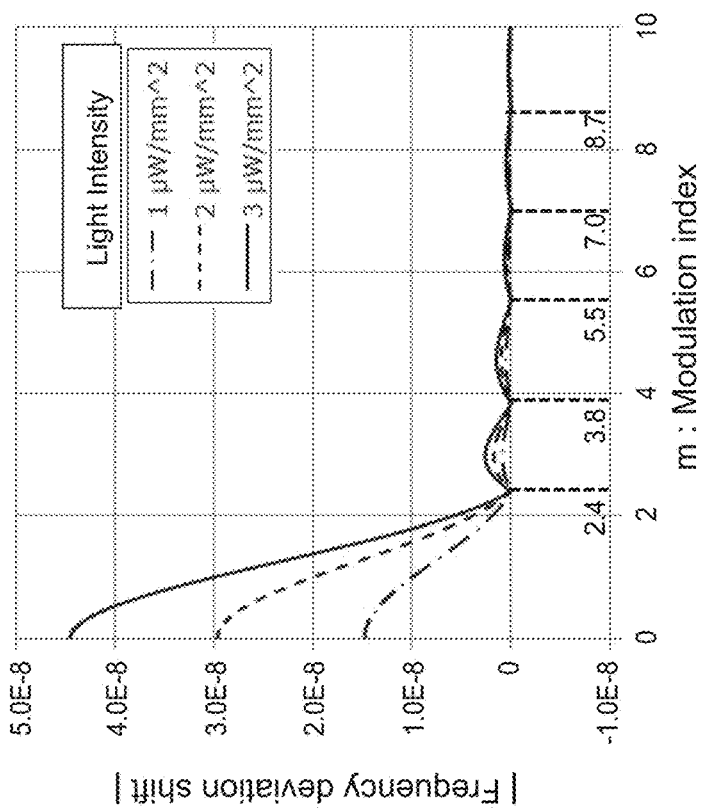
FIG. 15 is a diagram showing an example of a relationship between frequency deviation shift and modulation index according to the embodiment.
Figure 16:
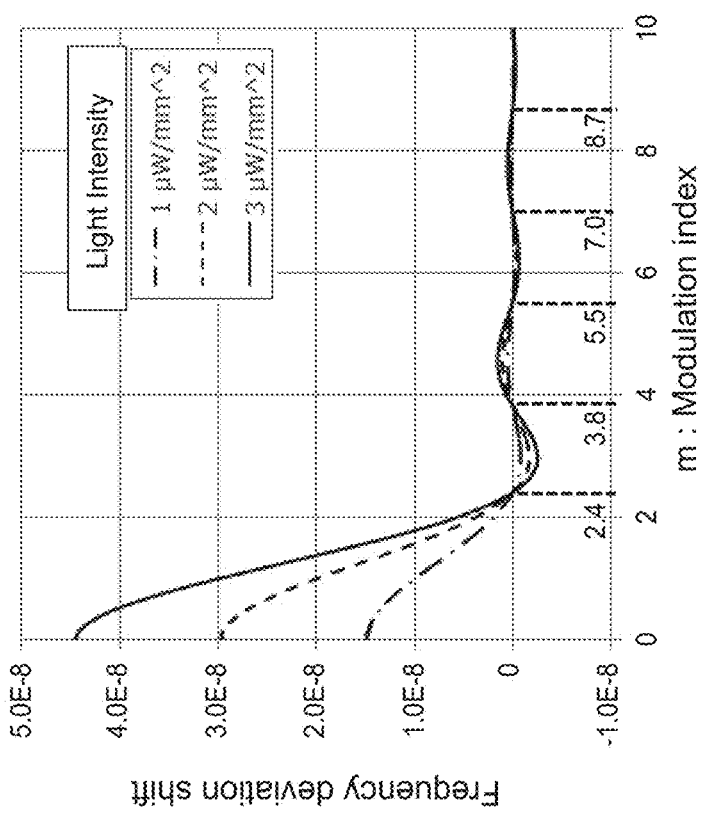
FIG. 16 is a diagram showing an example of a relationship between frequency deviation shift (absolute value) and modulation index according to the embodiment.

FIG. 15 is a diagram illustrating a relationship between frequency (oscillation frequency) deviation shift and a modulation index of the atomic oscillator according to the embodiment, and FIG. 16 is a diagram illustrating the frequency deviation shift as absolute values. The frequency deviation here is defined as "Stark shift/v21". For example, v21 is a ground-state hyperfine splitting frequency of a Cs atom, and in this case, v21=9.192631770 GHz. The frequency deviation shift represents the amount of variation of the frequency deviation from 0. In FIGS. 15 and 16, the aforementioned relationships for three types of light intensity are illustrated, the frequency deviation is 0 when the modulation indexes are 2.4, 3.8, 5.5, 7.0 and 8.7 for the light with any intensity, and it is recognized that the frequency deviation varies from 0 for other modulation indexes. The frequency deviation of 0 means that the Stark shift is thus 0.

The light intensity disclosed in FIGS. 15,16 and FIG. 17,18, which will be described later, represents the sum of light intensity of all frequency components including side band light components. 1 μW/mm$^2$, 2 μW/mm$^2$ and 3 μW/mm$^2$ are examples as the light intensity of the atomic oscillator according to the embodiment.

Figure 17:
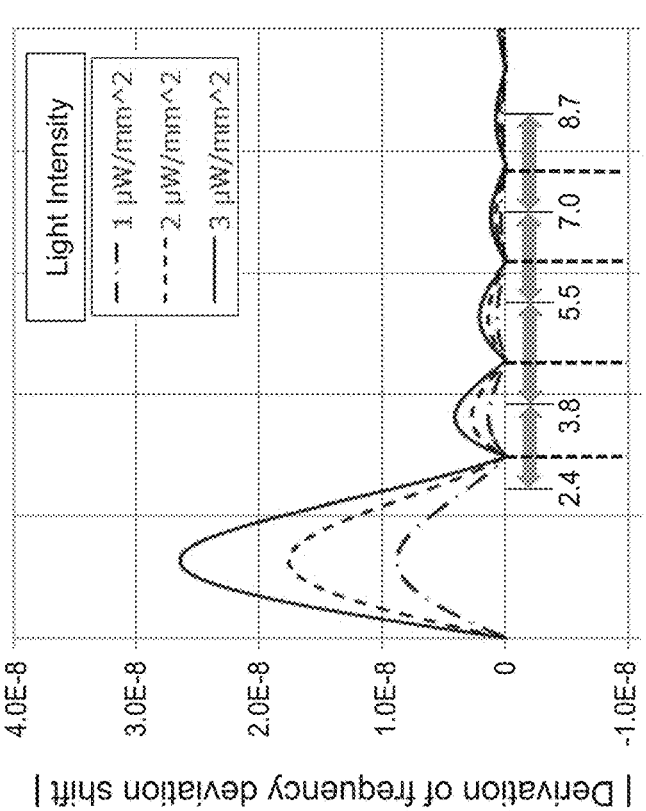
FIG. 17 is a diagram showing an example of a relationship between microwave sensitivity (a first-order differential value of oscillation frequency deviation by modulation index) and modulation index according to the embodiment.
Figure 18:
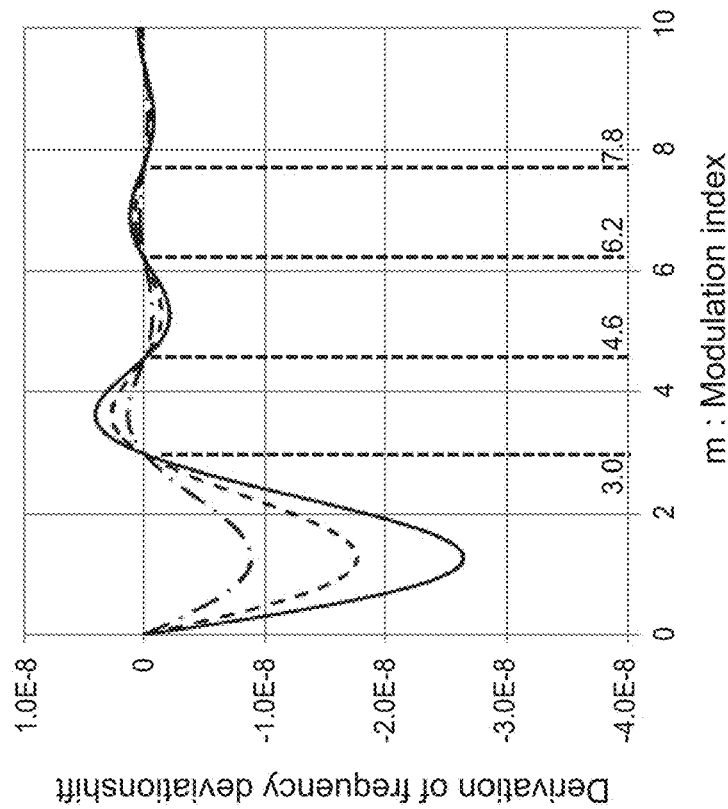
FIG. 18 is a diagram showing an example of a relationship between microwave sensitivity (a first-order differential value of oscillation frequency deviation by modulation index: absolute value) and modulation index according to the embodiment.

FIG. 17 is a diagram illustrating a relationship between microwave sensitivity (a first-order differential value of oscillation frequency deviation by modulation index) and the modulation index of the atomic oscillator according to the embodiment, and FIG. 18 is a diagram illustrating the microwave sensitivity as absolute values. The microwave sensitivity shift represents the amount of variation of the microwave sensitivity from 0. In FIGS. 17 and 18, the aforementioned relationships are represented for three types of light intensity, and the microwave sensitivity is 0 when the modulation indexes are 3.0, 4.6, 6.2 and 7.8 for the light with any intensity, and it is recognized that the microwave sensitivity varies from 0 for other modulation indexes.

The microwave sensitivity of 0 means that the variation in the microwave is 0 with respect to the variation in the modulation indexes.

In the atomic oscillator according to the embodiment, the modulation indexes are proportional to the intensity (amplitude) of an output signal (frequency modulation signal) of the frequency transform circuit 20. Thus, the modulation indexes in the atomic oscillator according to the embodiment are set such that the frequency deviation becomes small due to small microwave sensitivity even if the intensity of the output signal (frequency modulation signal) of the frequency transform circuit 20 varies in accordance with temperature properties in the circuit part when the environmental temperature around the atomic oscillator varies. That is, it is the most preferable to set the modulation indexes to 3.0, 4.6, 6.2 and 7.8. As described with reference to FIGS. 17 and 18, the microwave sensitivity is 0 when the modulation indexes are 3.0, 4.6, 6.2 and 7.8. In other words, a first-order differential value of oscillation frequency deviation by modulation index is 0 when the modulation index is one of 3.0, 4.6, 6.2 and 7.8. In contrast, the modulation indexes are set to have specific ranges at the time of the setting depending on properties of the atomic oscillator as a device. In the embodiment, the ranges are set as represented by arrows (⇆) in FIG. 18. The ranges of the modulation indexes set here do not include the modulation index of 0. The range of the lowest modulation index (range 1) is equal to or greater than 2.4 and equal to or less than 3.8 with the modulation index of 3.0 included therein. The range of the second lowest modulation index (range 2) is equal to or greater than 3.8 and equal to or less than 5.5 with the modulation index of 4.6 included therein.

In both the cases of the ranges 1 and 2, the microwave sensitivity with respect to the modulation indexes is 0 if the modulation indexes are most preferably set, such indexes are 3.0 or 4.6. Although the microwave sensitivity slightly varies from 0 in a case where the values are set at both ends such as 2.4 and 3.8, 3.8 and 5.5 of the set ranges, there is an effect that the variation in the oscillation frequency is minimized due to the Stark shift of the atomic oscillator since the modulation indexes are set such that the Stark shift is 0. When the modulation indexes are values set between the most preferable set values such as 3.0 or 4.6 and the values set at the both ends such as 2.4 and 3.8, 3.8 and 5.5 of the set ranges, it is possible to set intermediate well-balanced modulation indexes with small microwave sensitivity and small Stark shift.

Although any of the aforementioned ranges 1 and 2 may be selected, the intensity of the sideband light is higher, and the SN ratio of EIT signal intensity becomes satisfactory in a case where the range 1 is set. Also, it is possible to further reduce the power consumption of the atomic oscillator due to low intensity of the microwave. In FIGS. 15 and 16, modulation indexes, at which Stark shift is 0, are 2.4, 3.8 and 5.5. In addition to such modulation indexes, Stark shift is 0 at modulation index 7.0 and 8.7. Further, In FIGS. 17 and 18, modulation indexes, at which microwave sensitivity shift is 0, are 2.4, 3.8 and 5.5. In addition to such modulation indexes, microwave sensitivity shift is 0 at modulation index 6.2 and 7.8. Such that, upper ranges than the range 2 can be selectable. In other words, a first-order differential value of oscillation frequency deviation by modulation index is 0 when the modulation index is one of 3.0, 4.6, 6.2 and 7.8. Thus, there are other preferred ranges 3 and 4 in addition to the above ranges 1 and 2. That is, the range 3 is equal to or greater than 5.5 and equal to or less than 7.0 with the modulation index of 6.2 included therein. The range 4 is equal to or greater than 7.0 and equal to or less than 8.7 with the modulation index of 7.8 included therein.

2. ELECTRONIC APPARATUS

Figure 10:
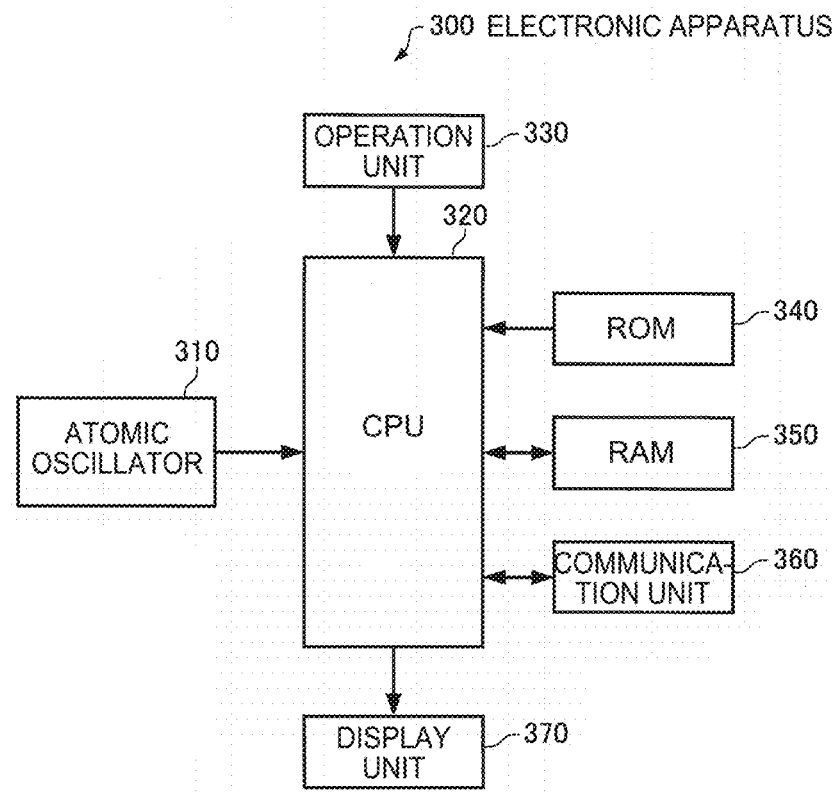
FIG. 10 is a functional block diagram of an electronic apparatus according to the embodiment.

FIG. 10 is a functional block diagram of an electronic apparatus according to this embodiment.

An electronic apparatus 300 according to the embodiment includes an atomic oscillator 310, a central processing unit (CPU) 320, an operation unit 330, a read only memory (ROM) 340, a random access memory (RAM) 350, a communication unit 360, and a display unit 370. In addition, the electronic apparatus according to the embodiment may have a configuration in which a part of the constituents (respective units) in FIG. 10 is appropriately omitted or changed or a configuration in which other constituents are added thereto.

The atomic oscillator 310 is the atomic oscillator 1 according to the aforementioned embodiments, which outputs a clock signal with high long-term stability.

The CPU 320 follows programs stored on the ROM 340 or the like and performs various kinds of calculation processing and control processing. Specifically, the CPU 320 performs various kinds of computation processing, various kinds of processing in response to operation signals from the operation unit 330, processing controlling the communication unit 360 for data communication with outside, processing of transmitting display signals to cause the display unit 370 to display various kinds of information, and the like in synchronization with a clock signal output from the atomic oscillator 310.

The operation unit 330 is an input device configured of an operation key, a button switch, and the like and outputs operation signals in accordance with user operations to the CPU 320.

The ROM 340 stores programs, data, and the like for the CPU 320 performing various kinds of calculation processing and control processing.

The RAM 350 is used as a work area of the CPU 320 and temporarily stores the programs and the data read from the ROM 340, data input from the operation unit 330, results of computation executed by the CPU 320 in accordance with the various programs, and the like.

The communication unit 360 performs various kinds of control for establishing data communication between the CPU 320 and external devices.

The display unit 370 is a display device configured of a liquid crystal display (LCD) or the like and displays various kinds of information based on a display signal input from the CPU 320. The display unit 370 may be provided with a touch panel which functions as the operation unit 330.

By incorporating the atomic oscillator 1 according to the embodiments as the atomic oscillator 310, it is possible to realize an electronic apparatus capable of maintaining high reliability for a long period of time.

Examples of such an electronic apparatus 300 include a time management server (time server) which realizes synchronization with the standard time, a time management device (time stamp server) which issues a time stamp, for example, and a frequency reference device such as a base station. Other various electronic apparatuses can be considered as the electronic apparatus 300, and examples thereof include personal computers (a mobile personal computer, a laptop personal computer, and a tablet personal computer, for example), mobile terminals such as a smart phone and a mobile phone, a digital still camera, an ink-jet ejecting apparatus (an ink-jet printer, for example), storage area network devices such as a router and a switch, a local area network device, a device for a mobile terminal base station, a television, a video camera, a video recorder, a car navigation apparatus, a real-time clock device, a pager, an electronic organizer (including an electronic organizer with a communication function), an electronic dictionary, a calculator, an electronic game device, a game controller, a word processor, a work station, a video telephone, a security television monitor, an electronic binocular, a POS terminal, medical equipment (an electronic thermometer, a hemopiezometer, a blood glucose meter, an electrocardiograph measurement apparatus, an ultrasonic diagnosis apparatus, and an electronic endoscope), a fish sonar, various measurement devices, meter gauges (meter gauges for a vehicle, an aircraft, a marine vessel, for example), a flight simulator, a head-mount display, motion trace, motion tracking, a motion controller, and a pedestrian dead-reckoning (PDR).

3. MOVING OBJECT

Figure 11:
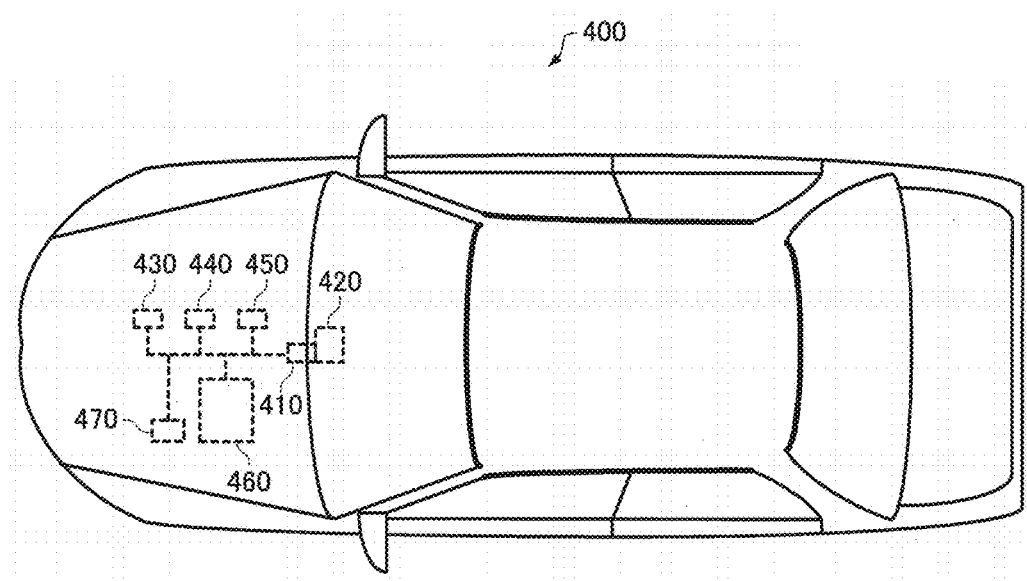
FIG. 11 is a diagram showing an example of a moving object according to the embodiment.
Figure 12:
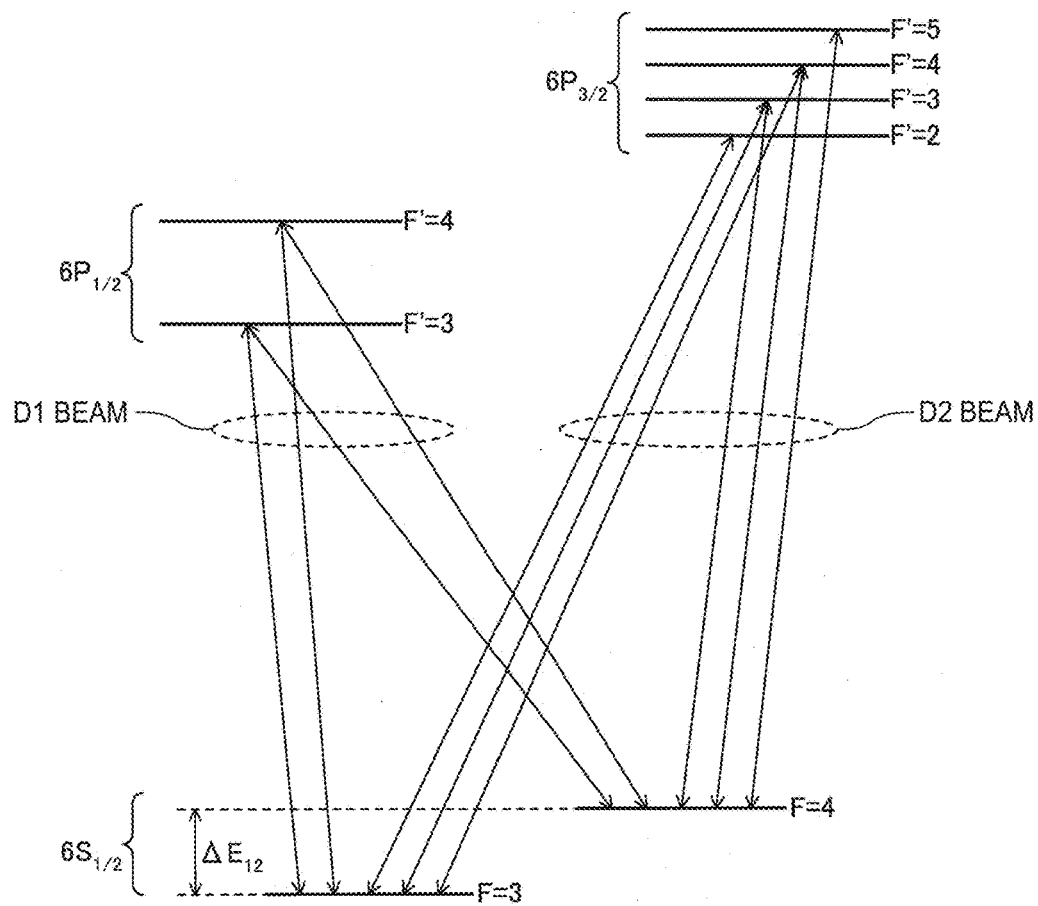
FIG. 12 is a diagram schematically showing energy levels of a cesium atom.
Figure 13:
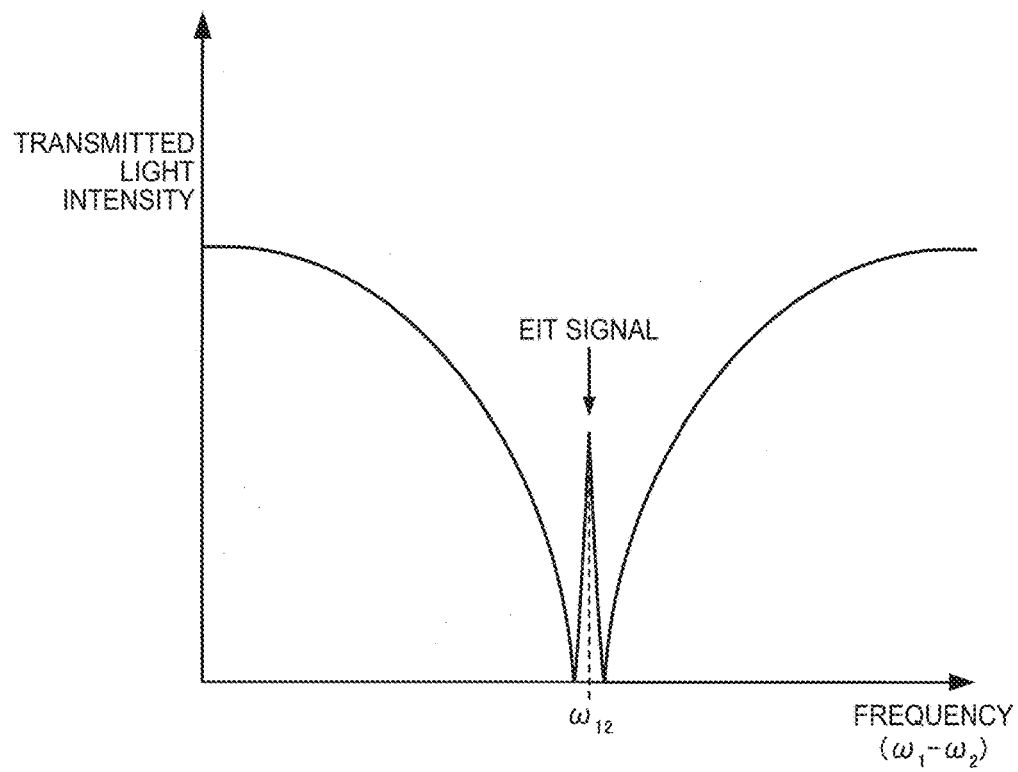
FIG. 13 is an outline diagram showing an example of an EIT signal.
Figure 14:
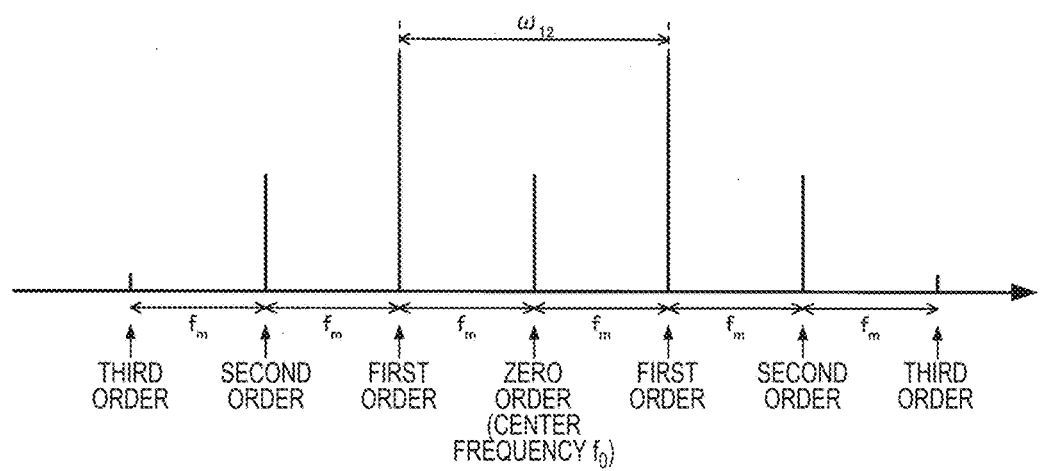
FIG. 14 is an outline diagram showing a frequency spectrum of light emitted by a semiconductor laser in the related art.

FIG. 11 is a diagram (upper view) showing an example of a moving object according to the embodiment. A moving object 400 shown in FIG. 11 includes an atomic oscillator 410, a car navigation device 420, controllers 430, 440, and 450, a battery 460, and a back-up battery 470. In addition, the moving object according to the embodiment may have a configuration in which a part of the constituents (respective units) in FIG. 11 is appropriately omitted or changed or a configuration in which other constituents are added thereto.

The atomic oscillator 410 is for outputting a clock signal with long-term stability, and the atomic oscillator 1 according to the aforementioned embodiments can be applied to the atomic oscillator 410.

The car navigation device 420 displays various kinds of information such as a position and a time in synchronization with the clock signal output from the atomic oscillator 410.

The controllers 430, 440, and 450 perform various kinds of control on an engine system, a brake system, a key-less entry system, and the like. The controllers 430, 440, and 450 may perform the various kinds of control in synchronization with the clock signal output from the atomic oscillator 410.

The moving object 400 according to this embodiment can maintain high reliability for a long period of time by being provided with the atomic oscillator 410.

Various moving objects can be considered as such a moving object 400, and examples thereof include a vehicle (including an electric vehicle), aircrafts such as a jet aircraft and a helicopter, a marine vessel, a rocket, and an artificial satellite.

4. APPLICATION EXAMPLES

According to the atomic oscillator of the aforementioned embodiments, Zeeman Splitting occurs in the energy levels of the alkali metal atoms if a magnetic field is applied to the gas cell 13, and the frequency difference $\omega_{21}$ of the resonance light pair which causes the EIT phenomenon varies depending on intensity of the magnetic field (the oscillation frequency varies as a result). By utilizing this property, it is possible to apply the atom oscillator according to the embodiments to a magnetic sensor.

In addition, since the atomic oscillator according to the embodiments can create a significantly stable quantum interference state (quantum coherence state) of the alkali metal atoms, it is possible to realize a light source used for quantum information devices such as a quantum computer, a quantum memory, and a quantum cryptographic system by extracting the resonance light pair which is incident on the gas cell 13.

The invention is not limited to the embodiments, and various modifications can be made within the scope of the gist of the invention.

The aforementioned embodiments and modification examples are illustrative examples, and the invention is not limited thereto. For example, it is possible to appropriately combine the respective embodiments and the respective modification examples.

The invention includes configurations which are substantially the same with the configurations described in the embodiments (a configuration with the same functions, the same methods, and the same results or a configuration with the same purposes and advantages, for example). In addition, the invention includes configurations in which a part that is not essential part of the configurations described in the embodiments is replaced. Moreover, the invention includes configurations which exhibit the same effects as those of the configurations described in the embodiment or configurations with which the same purpose can be achieved. In addition, the invention includes configuration achieved by adding a known technology to the configurations described in the embodiments.

What is claimed is:

1. An atomic oscillator comprising:
a cell which encapsulates metal atoms therein;
a light source which generates light for irradiation of the cell; and
a frequency modulation signal generator configured to generate a frequency modulation signal for causing the light source to generate the light, the light being frequency-modulated and including a resonance light pair, the resonance light pair causing an electromagnetically induced transparency phenomenon in the metal atoms,
wherein modulation indexes of the frequency modulation signal include a first modulation index, and
a first-order differential value of oscillation frequency deviation of the atomic oscillator is zero at the first modulation index.

2. The atomic oscillator according to claim 1,
wherein the modulation indexes include two or more modulation indexes at which the first-order differential value of the oscillation frequency deviation of the atomic oscillator is zero, and
the first modulation index is a smallest index among the two or more modulation indexes.

3. The atomic oscillator according to claim 1,
wherein the modulation indexes include two or more modulation indexes at which the first-order differential value of the oscillation frequency deviation of the atomic oscillator is zero, and
the first modulation index is a second smallest index among the two or more modulation indexes.

4. The atomic oscillator according to claim 1,
wherein the first modulation index is 3.0.

5. The atomic oscillator according to claim 1,
wherein the first modulation index is 4.6.

6. An electronic apparatus comprising:
the atomic oscillator according to claim 1, the atomic oscillator configured to generate a clock signal;
a processor configured to perform processing in synchronization with the clock signal; and
a housing configured to house the atomic oscillator and the processor.

7. A moving object comprising:
the atomic oscillator according to claim 1; and
a movable body configured to house the atomic oscillator.

* * * * *